(12) United States Patent
Chen

(10) Patent No.: US 10,186,224 B2
(45) Date of Patent: Jan. 22, 2019

(54) PIXEL STRUCTURES AND OPERATION METHODS, AND ARRAY SUBSTRATES

(71) Applicant: Shenzhen China Star Optoelectronics Technology Co., Ltd., Shenzhen, Guangdong (CN)

(72) Inventor: Shuai Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 90 days.

(21) Appl. No.: 15/328,620

(22) PCT Filed: Jan. 12, 2017

(86) PCT No.: PCT/CN2017/071005
§ 371 (c)(1),
(2) Date: Jan. 24, 2017

(87) PCT Pub. No.: WO2018/120298
PCT Pub. Date: Jul. 5, 2018

(65) Prior Publication Data
US 2018/0211625 A1    Jul. 26, 2018

(51) Int. Cl.
*G09G 3/36*    (2006.01)
*G02F 1/1368*   (2006.01)
*H01L 27/12*    (2006.01)
*G02F 1/1362*   (2006.01)

(52) U.S. Cl.
CPC ......... *G09G 3/3677* (2013.01); *G02F 1/1368* (2013.01); *G02F 1/136213* (2013.01); *G02F 1/136286* (2013.01); *H01L 27/124* (2013.01); *H01L 27/1255* (2013.01)

(58) Field of Classification Search
None
See application file for complete search history.

(56) References Cited

U.S. PATENT DOCUMENTS 9,007,359 B2 *   4/2015   Tae ................... G02F 1/136213
                                                           345/214

\* cited by examiner

*Primary Examiner* — Kenneth B Lee, Jr.
(74) *Attorney, Agent, or Firm* — Andrew C. Cheng

(57) ABSTRACT

The present disclosure relates to a pixel structure including a data line, a gate, a pixel electrode, and a common electrode line driving the gate. A capacitor configured between the common electrode line and the pixel electrode is a storage capacitance. The common electrode line and the gate are short-connected. The present disclosure also relates to an operation method of the pixel structures and an array substrate. In view of the above, the driving capability of the common electrode line is enhanced. Second, the WOA trace of the common electrode line may be decreased. Third, the space of the liquid crystal panel may be saved.

3 Claims, 2 Drawing Sheets

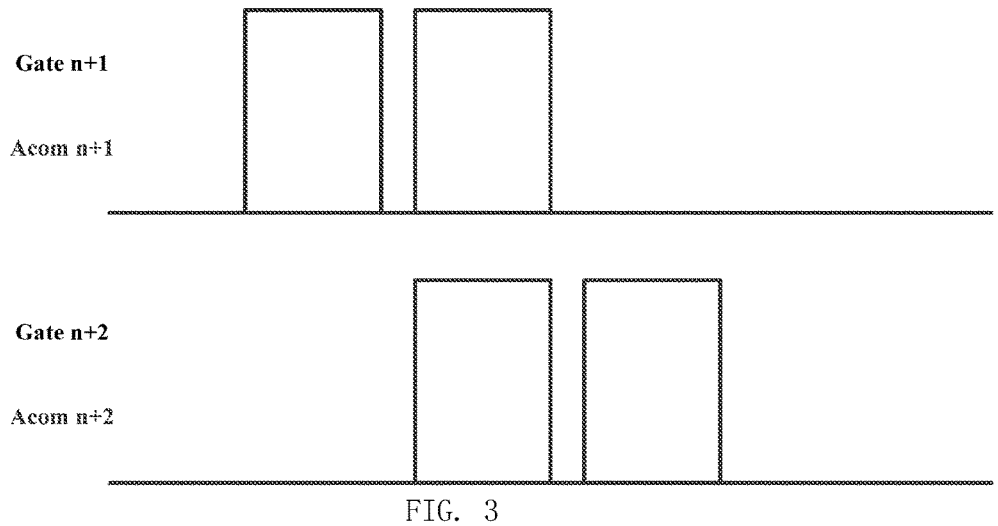

FIG. 3 after a gate signal potential at a n-th level is turned off, the potential remains at a low level, at this moment, the potential of the common electrode line of the storage capacitance at the (n+1)-th level is at the low level after the gate signal potential at the n-th level (Gate(n)) is turned on, the potential remains at the high level (Vhigh), the pixel electrode of the storage capacitance at the (n+1)-th level is normally charged, the potential of the common electrode line of the storage capacitance at the (n+1)-th level remains at the low level, the potential of the storage capacitance at the (n+2)-th level remains at the high level (Vhigh)

after the gate signal potential at the (n+1)-th level is turned off, the potential remains at the low level (Vlow), and the potential of the common electrode line (ACOM) of the storage capacitance at the (n+2)-th level remains at the low level (Vlow)

after the gate signal potential at the (n+2)-th level turned on, the potential remains at the high level (Vhigh), and the potential of the common electrode line of the storage capacitance at the (n+2)-th level remains at the low level (Vlow)

FIG. 4

PIXEL STRUCTURES AND OPERATION METHODS, AND ARRAY SUBSTRATES

BACKGROUND OF THE INVENTION

1. Field of the Invention

The present disclosure relates to thin film transistor (TFT) display technology, and more particularly to a pixel structure, an operation method, and an array substrate for enhancing a voltage regulation of the common electrode of a liquid crystal panel.

2. Discussion of the Related Art

Crosstalk is a common issue with respect to TFT-LCD displays, which means the image in a specific area may affect the image in another area. The crosstalk may include a vertical crosstalk and a horizontal crosstalk according to the location of the crosstalk. Taking the vertical alignment (VA) display mode as one example, the horizontal crosstalk means that the defective issue occurs along a horizontal direction. There are various reasons that may cause the crosstalk, here, only the horizontal crosstalk is discussed. Usually, different driving method may result in different horizontal crosstalk. For instance, the frame inversion may result in line-shaped horizontal crosstalk, and row inversion or column inversion may only cause slight horizontal crosstalk. However, regardless of the driving methods, the defective images are all caused by the capacitance coupling effect between the data line and the common electrode. When the potential of the data line changes, the parasitic capacitance ($C_{DC}$) between the data line and the common electrode line (ACOM) forms an instantaneous potential jump in the common electrode line. IF the signal delay of the common electrode line (ACOM) is more serious or the voltage driving capability is not enough, the potential may not be back to a predetermined potential quickly. The potential jump may pull down a pixel spanning voltage by the coupling effect of the storage capacitance (Cst), which results in a lower brightness so as to form the horizontal crosstalk. With respect to the VA display mode, taking a row inversion as one example, the potential of the driving voltage of on data line is 128 grayscale, and another driving voltage has a two-thirds time of 128 gray-scale potentials, one-third time of 255 grayscale potential. The potentials of the two data lines are periodically inversed such that the potential of the common electrode lines changes accordingly, such change may result in a darker image. The horizontal area of the 255 grayscale potential may include a darker horizontal block due to a greater change of the common electrode line. Usually, the horizontal crosstalk may be solved by adopting the column inversion or the dot inversion. However, such solution may be easily affected by the change of the manufacturing process. That is, the left and the right data line may cause different capacitance coupling effect toward the common electrode line, and thus the horizontal crosstalk may not be eliminated at all.

Under 4MASK manufacturing process, the parasitic capacitance ($C_{DC}$) between the data line and the common electrode line includes a first metal layer (Metal1), an AS layer, a SiNx layer, and a second metal layer (Metal2). The AS layer and the N+ layer are configured between the Metal1 and the Metal2, such that the parasitic capacitance ($C_{DC}$) may be different in accordance with the positive frame or the negative driving method is adopted, which are respectively represented as $C_{DC}+$ and $C_{DC}-$. Such change may result in a greater difference between the capacitance coupling effect between the two data lines and the common electrode line.

Currently, the keel structure is transversely interpenetrated, and the metal lines at two sides provide DC driving voltage. Such design may cause the ACOM driving capability not enough. Thus, it is necessary to provide a structure and a method of high driving capability of the common electrode line (ACOM).

SUMMARY

The present disclosure relates to overcome the technical issue of the common electrode line (ACOM) driving capability. By short-connecting the common electrode line (ACOM) and the gate signal line, the pixel structure is capable of enhancing the driving capability of the common electrode line (ACOM).

In one aspect, a pixel structure includes: a data line, a gate, a pixel electrode, and a common electrode line driving the gate, a capacitor configured between the common electrode line and the pixel electrode is a storage capacitance, and the common electrode line electrically connects to the gate.

Wherein the common electrode line and the gate are arranged on the same layer and are connected.

Wherein the common electrode line and the gate are short-connected via at least one metal line.

Wherein a potential of the common electrode line is the same with the potential of the gate, the gate signals at the n-th level is the same with the potential of the common electrode line of the storage capacitance at the (n+1)-th level, and wherein n=1, 2, 3, . . . .

In another aspect, an array substrate includes: a pixel structure comprising a data line, a gate, a pixel electrode, and a common electrode line driving the gate, a capacitor configured between the common electrode line and the pixel electrode is a storage capacitance, and the common electrode line electrically connects to the gate; the common electrode line within each of the pixel structures electrically connects to one corresponding gate.

Wherein the common electrode line within each of the pixel structures electrically connects to one corresponding gate.

In another aspect, an operation method of pixel structures includes: a pixel structure comprising a data line, a gate, a pixel electrode, and a common electrode line driving the gate, a capacitor configured between the common electrode line and the pixel electrode is a storage capacitance, and the common electrode line electrically connects to the gate; the method includes: (1) after a gate signal potential at a n-th level is turned off, the potential remains at a low level, at this moment, the potential of the common electrode line of the storage capacitance at the (n+1)-th level is at the low level; (2) after the gate signal potential at the n-th level is turned on, the potential remains at the high level, the pixel electrode of the storage capacitance at the (n+1)-th level is normally charged, the potential of the common electrode line of the storage capacitance at the (n+1)-th level remains at the low level, the potential of the storage capacitance at the (n+2)-th level remains at the high level; (3) after the gate signal potential at the (n+1)-th level is turned off, the potential remains at the low level, and the potential of the common electrode line of the storage capacitance at the (n+2)-th level remains at the low level; (4) after the gate signal potential at the (n+2)-th level turned on, the potential remains at the high level, and the potential of the common electrode line of the storage capacitance at the (n+2)-th level remains at the low level; (5) repeating steps (1) through (4).

Wherein the operation method further includes: before the n-th gate signal potential is turned on, the potential of the common electrode line of the storage capacitance at the n-th level is at the low level.

Wherein after the gate signal potential at the n-th level is turned off and after a time period, the gate signal potential at the (n+1)-th level is turned on.

Compared to the conventional configuration between the ACOM and the scanning driving gate (Gate), i.e., the ACOM and the scanning driving gate (Gate) are short-connected, the driving capability of the ACOM is enhanced. Before each of the scanning driving gates (Gate) is turned on, the potential of the ACOM may be stably maintained, i.e., Vlow. The advantage of such configuration resides in that: the potential of the scanning driving gate (Gate) is independently controlled by an integrated circuit (IC). Not only the driving capability may be enhanced, but also the WOA wirings solely for controlling the common electrode lines may be decreased. With such configuration, the wider space may be adopted to accomplish other designs of the liquid crystal panel.

In view of the above, the driving capability of the common electrode line is enhanced. Second, the WOA trace of the common electrode line (ACOM) may be decreased. Third, the space of the liquid crystal panel may be saved.

BRIEF DESCRIPTION OF THE DRAWINGS

FIG. 3 is a waveform diagram of the common electrode line (ACOM) and the gate line signals at the n-th level in accordance with one embodiment.

FIG. 4 is a flowchart of the operation method in accordance with one embodiment.

DETAILED DESCRIPTION OF THE EMBODIMENTS

Embodiments of the invention will now be described more fully hereinafter with reference to the accompanying drawings, in which embodiments of the invention are shown.

Figure 1:
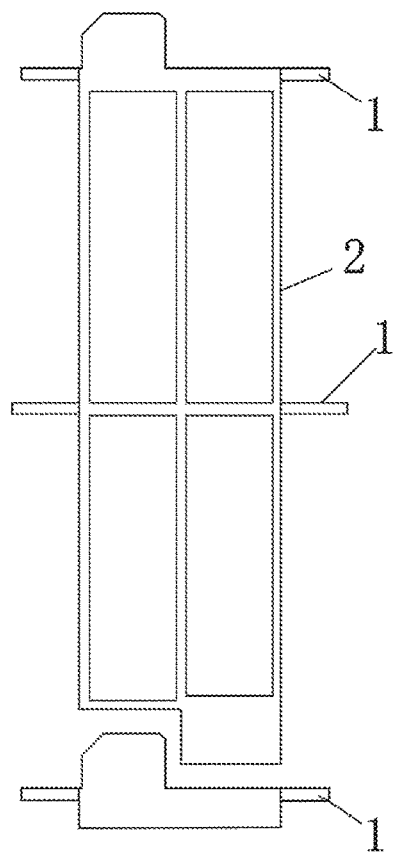
FIG. 1 is a schematic view of the pixel structure in accordance with one embodiment.
Figure 2:
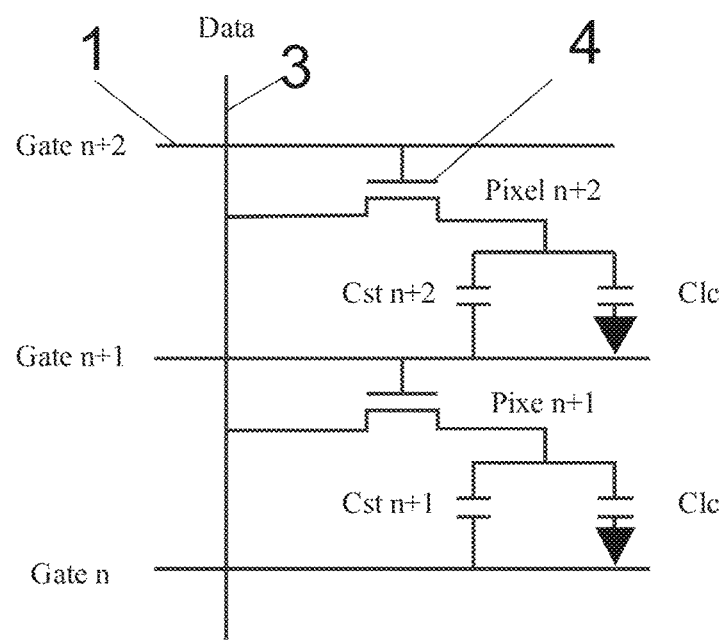
FIG. 2 is an equivalent circuit diagram in accordance with one embodiment.

FIGS. 1 and 2 are schematic views of the pixel structure in accordance with one embodiment. The pixel structure includes a data line 3 (DATA), a gate 1 (Gate), a pixel electrode 4 (Pixel), and a common electrode line 2 (ACOM) driving the gate, a capacitor between the common electrode line 2 (ACOM) and the pixel electrode 4 (Pixel) is a storage capacitance (Cst), and the common electrode line 2 (ACOM) and the gate 1 (Gate) are short-connected, and the common electrode line 2 (ACOM) and the gate 1 (Gate) below the common electrode line 2 (ACOM) are disconnected.

A potential of the gate 1 (Gate) is independently controlled by an integrated circuit (IC). The potential of the common electrode line 2 (ACOM) is the same with the potential of the gate 1 (Gate).

As shown in FIG. 2, the potential of the gate 1 (Gate), the gate signals at the n-th level (Gate(n)), and the common electrode line 2 (ACOM) of the storage capacitance (Cst) at the (n+1)-th level are the same, wherein n=1, 2, 3, . . . .

The pixel electrode for enhancing a voltage regulation of the common electrode of a liquid crystal panel may be adopted in TFT-LCD display device, wherein the array substrate includes the above pixel structure, and the common electrode line 2 (ACOM) within each of the pixel structures electrically connects to one corresponding gate 1 (Gate).

FIG. 2 is an equivalent circuit diagram in accordance with one embodiment. FIG. 4 is a flowchart of the operation method in accordance with one embodiment. The method includes the following steps.

In step (1), after the gate signal potential at the n-th level (Gate(n)) is turned off, the potential remains at the low level (Vlow), at this moment, the potential of the common electrode line 2 (ACOM) of the storage capacitance (Cst) at the (n+1)-th level, i.e., Cst(n+1), is at the low level (Vlow).

In step (2), after the gate signal potential at the n-th level (Gate(n)) is turned on, the potential remains at the high level (Vhigh), the pixel electrode 4 (Pixel) of the storage capacitance (Cst(N+1)) is normally charged, the potential of the common electrode line 2 (ACOM) of the storage capacitance (Cst(N+1)) remains at the low level (Vlow), the potential of the storage capacitance (Cst(N+2)) remains at the high level (Vhigh).

In step (3), after the gate signal potential at the (n+1)-th level (Gate(n+1)) is turned off, the potential remains at the low level (Vlow), and the potential of the common electrode line (ACOM) of the storage capacitance (Cst(N+2)) remains at the low level (Vlow).

In step (4), after the gate signal potential at the (n+2)-th level (Gate(n+2)) is turned on, the potential remains at the high level (Vhigh), and the potential of the common electrode line (ACOM) of the storage capacitance (Cst(N+2)) remains at the low level (Vlow).

In step (5), the steps (1) through (4) are repeated.

As shown in FIGS. 3 and 4, before the n-th gate signal potential is turned on, the potential of the common electrode line (ACOM) of the storage capacitance (Cst) at the n-th level (Cst(n)) is at the low level (Vlow). After the gate signal potential at the n-th level is turned off after a time period (t), the gate signal potential at the (n+1)-th level, i.e., Gate(n+1), is turned on.

In another embodiment, the common electrode line may connect to the gate line via metal on other layers via through holes. For instance, a conductive layer may be configured within an insulation layer so as to connect the common electrode line and the gate.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An operation method of pixel structures, comprising:
a pixel structure comprising a data line, a gate, a pixel electrode, and a common electrode line driving the gate, a capacitor configured between the common electrode line and the pixel electrode is a storage capacitance, and the common electrode line electrically connects to the gate;
the method comprises:
(1) after a gate signal potential at a n-th level is turned off, the potential remains at a low level, at this moment, the potential of the common electrode line of the storage capacitance at the (n+1)-th level is at the low level;
(2) after the gate signal potential at the n-th level is turned on, the potential remains at the high level, the pixel electrode of the storage capacitance at the (n+1)-th level is normally charged, the potential of the common electrode line of the storage capacitance at the (n+1)-th level remains at the low level, the potential of the storage capacitance at the (n+2)-th level remains at the high level;

(3) after the gate signal potential at the (n+1)-th level is turned off, the potential remains at the low level, and the potential of the common electrode line of the storage capacitance at the (n+2)-th level remains at the low level;

(4) after the gate signal potential at the (n+2)-th level turned on, the potential remains at the high level, and the potential of the common electrode line of the storage capacitance at the (n+2)-th level remains at the low level;

(5) repeating steps (1) through (4).

2. The operation method as claimed in claim 1, wherein the operation method further comprises: before the n-th gate signal potential is turned on, the potential of the common electrode line of the storage capacitance at the n-th level is at the low level.

3. The operation method as claimed in claim 1, wherein after the gate signal potential at the n-th level is turned off and after a time period, the gate signal potential at the (n+1)-th level is turned on.

\* \* \* \* \*